(12) United States Patent
Itou et al.

(10) Patent No.: US 11,395,405 B2
(45) Date of Patent: Jul. 19, 2022

(54) WIRING SUBSTRATE AND ELECTRONIC DEVICE

(71) Applicant: KYOCERA Corporation, Kyoto (JP)

(72) Inventors: Seiichirou Itou, Kyoto (JP); Yuichiro Ishizaki, Kyoto (JP); Genshitaro Kawamura, Kyoto (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 17/269,054

(22) PCT Filed: Aug. 27, 2019

(86) PCT No.: PCT/JP2019/033526
§ 371 (c)(1),
(2) Date: Feb. 17, 2021

(87) PCT Pub. No.: WO2020/045436
PCT Pub. Date: Mar. 5, 2020

(65) Prior Publication Data
US 2021/0243892 A1 Aug. 5, 2021

(30) Foreign Application Priority Data
Aug. 28, 2018 (JP) .............................. JP2018-159435

(51) Int. Cl.
*H05K 1/11* (2006.01)
*H05K 1/09* (2006.01)
*H05K 1/05* (2006.01)
*H01L 23/13* (2006.01)
*H01L 23/14* (2006.01)
*H01L 23/495* (2006.01)
*H05K 1/16* (2006.01)

(52) U.S. Cl.
CPC .............. *H05K 1/053* (2013.01); *H01L 23/13* (2013.01); *H01L 23/142* (2013.01); *H01L 23/49531* (2013.01); *H05K 1/09* (2013.01); *H05K 1/16* (2013.01); *H05K 2201/0317* (2013.01)

(58) Field of Classification Search
CPC . H05K 1/111; H05K 1/16; H05K 1/09; H05K 1/053; H05K 2201/0317
See application file for complete search history.

(56) References Cited

U.S. PATENT DOCUMENTS

| | | | | |
|---|---|---|---|---|
| 5,738,931 | A * | 4/1998 | Sato ................... | H01F 17/0006 428/209 |
| 9,150,002 | B2 * | 10/2015 | Lee ......................... | C22C 19/03 |
| 9,420,699 | B2 * | 8/2016 | Yi ............................ | C25D 5/02 |
| 9,801,288 | B2 * | 10/2017 | Wei ...................... | H05K 3/0091 |

(Continued)

FOREIGN PATENT DOCUMENTS

| JP | 05-109925 A | 4/1993 |
|---|---|---|
| JP | 2000-299202 A | 10/2000 |

(Continued)

*Primary Examiner* — Hoa C Nguyen
(74) *Attorney, Agent, or Firm* — Volpe Koenig

(57) ABSTRACT

A wiring substrate includes: an insulating substrate comprising a principal face; a wiring line located on the principal face; and a protruding portion on a side of the wiring line, the protruding portion being smaller in thickness than the wiring line and protrudes from the side along the principal face.

20 Claims, 3 Drawing Sheets

(56) References Cited

U.S. PATENT DOCUMENTS

| | | | | |
|---|---|---|---|---|
| 2004/0185683 | A1* | 9/2004 | Nakamura | H01L 21/76843 |
| | | | | 438/125 |
| 2005/0116344 | A1* | 6/2005 | Humpston | H01L 24/02 |
| | | | | 257/750 |
| 2010/0193225 | A1 | 8/2010 | Abe et al. | |
| 2017/0358724 | A1* | 12/2017 | Shichijo | H01L 33/507 |

FOREIGN PATENT DOCUMENTS

| JP | 2001-102722 A | 4/2001 |
|---|---|---|
| JP | 2006-108126 A | 4/2006 |

* cited by examiner

WIRING SUBSTRATE AND ELECTRONIC DEVICE

CROSS-REFERENCE TO RELATED APPLICATION

This application is a national stage entry according to 35 U.S.C. 371 of International Application No. PCT/JP2019/033526 filed on Aug. 27, 2019, which claims priority to Japanese Patent Application No. 2018-159435 filed on Aug. 28, 2018, the contents of which are entirely incorporated herein by reference.

TECHNICAL FIELD

The present disclosure relates to a wiring substrate and an electronic device.

BACKGROUND

Heretofore a wiring substrate including an insulating substrate with a wiring line located thereon, an electronic component-mounted electronic device, etc. are known (refer to Japanese Unexamined Patent Publication JP-A 2001-102722, for example).

SUMMARY

A wiring substrate according to the disclosure includes: an insulating substrate including a principal face; a wiring line located on the principal face; and a protruding portion on a side of the wiring line, the protruding portion being smaller in thickness than the wiring line and protrudes from the side along the principal face.

An electronic device according to the disclosure includes: the wiring substrate described above; and an electronic component mounted on the wiring substrate.

DETAILED DESCRIPTION

Figure 1:
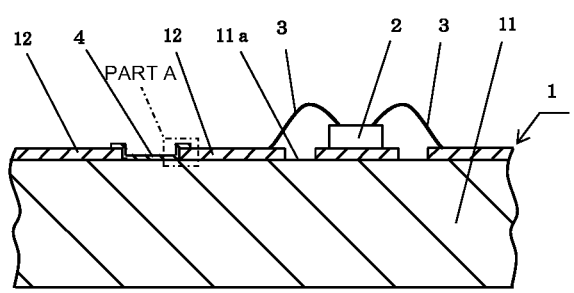
FIG. 1 is a vertical sectional view showing an electronic device according to an embodiment of the disclosure.
Figure 2:
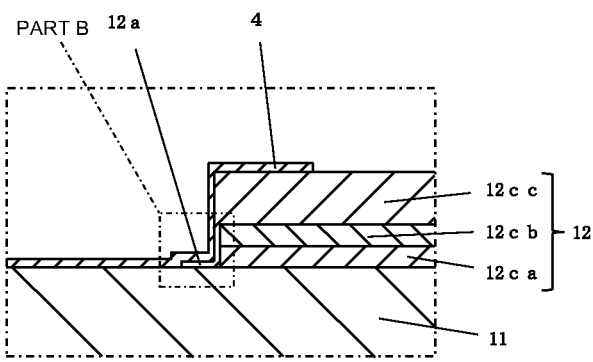
FIG. 2 is an enlarged view of main parts in Part A shown in FIG. 1.
Figure 3:
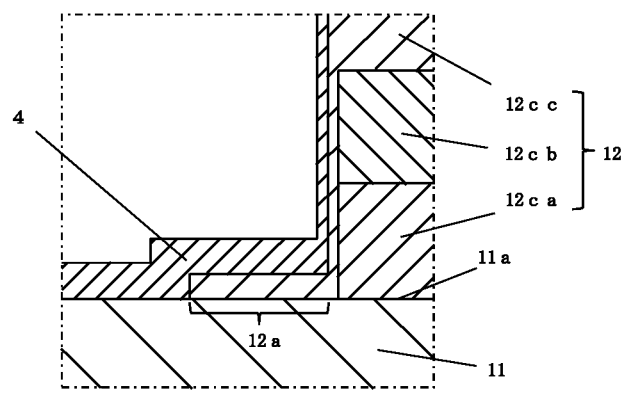
FIG. 3 is an enlarged view of main parts in Part B shown in FIG. 2.
Figure 4:
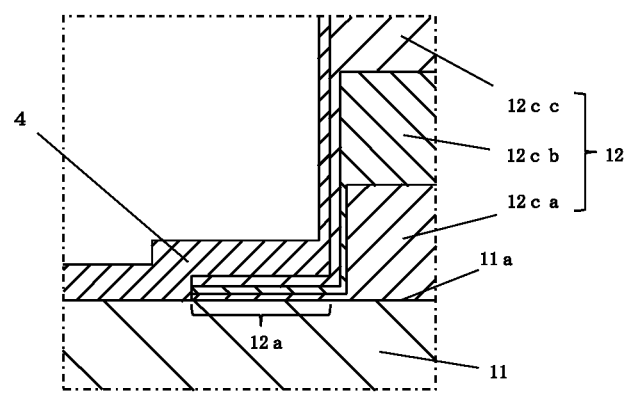
FIG. 4 is a main-part enlarged view showing another example of the electronic device according to the embodiment.
Figure 5:
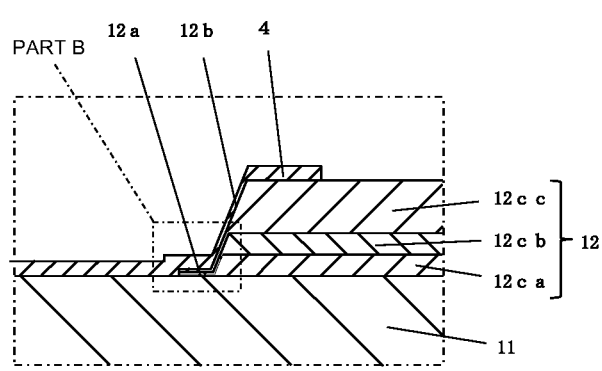
FIG. 5 is a main-part enlarged view, corresponding to Part A shown in FIG. 1, showing still another example of the electronic device according to the embodiment.
Figure 6:
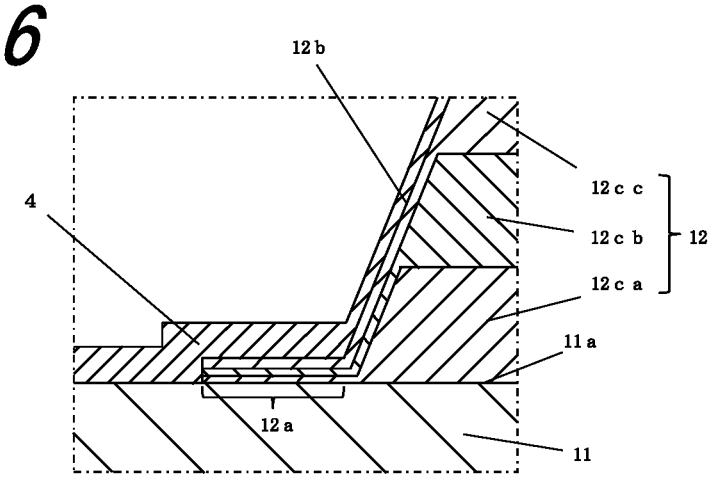
FIG. 6 is an enlarged view of main parts in Part B shown in FIG. 5.
Figure 7:
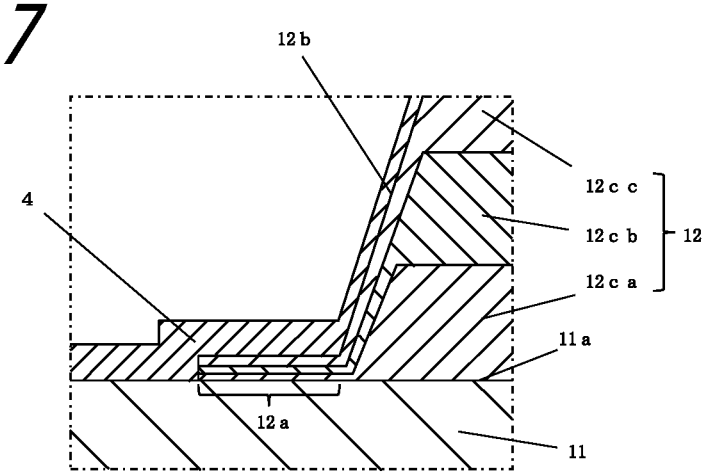
FIG. 7 is a main-part enlarged view showing still another example of the electronic device according to the embodiment.

Exemplary embodiments of the disclosure will now be described with reference to the accompanying drawings.

Referring to FIGS. 1 to 8, an electronic device according to an embodiment of the disclosure will be described. The electronic device according to this embodiment includes: a wiring substrate 1; a resistor layer 4; and an electronic component 2.

In this embodiment, for example, the wiring substrate 1 includes: an insulating substrate 11 including a principal face 11a; and a wiring line (a thin-film wiring line, for instance) 12 located on the principal face 11a.

The insulating substrate 11 may be made of ceramics, e.g. an aluminum oxide sintered body (alumina ceramics), an aluminum nitride sintered body, a mullite sintered body, or a glass ceramics sintered body.

In the case where the insulating substrate 11 is made of a resin material, for example, it is possible to use epoxy resin, polyimide resin, acrylic resin, phenol resin, polyester resin, and fluorine resin typified by tetrafluoroethylene resin.

For example, if using an aluminum nitride sintered body for the insulating substrate 11, the insulating substrate 11 is produced by preparing a slurry by admixing suitable organic binder, solvent, etc. in powder of raw materials, including aluminum nitride used as a main component, and yttria, erbia, etc. used as sintering aids; shaping the slurry into a sheet by using, for example, a doctor blade method or a calender roll method to obtain a ceramic green sheet; subjecting the ceramic green sheet to a suitable punching process; stacking a plurality of ceramic green sheets into a green laminate for forming the insulating substrate 11; and firing the green laminate at a high temperature (about 1800° C.). Note that aluminum nitride is defined as a main component so long as it is contained in the insulating substrate 11 in an amount of greater than or equal to 80% by mass based on 100% by mass set as the total mass of the insulating substrate 11. An aluminum nitride content in the insulating substrate 11 may be set at or above 95% by mass. The insulating substrate 11 having an aluminum nitride content of 95% by mass or greater is likely to exhibit a thermal conductivity of 150 W/mK or greater, thus allowing the wiring substrate 1 to deliver good heat dissipation performance.

The insulating substrate 11 is intended for the installation of the electronic component 2 such as a semiconductor laser device. As in examples shown in FIGS. 1 to 8, the insulating substrate 11 is quadrangular in plan configuration.

For example, the wiring line 12 has the form of thin-film wiring line including a plurality of metallic layers located on the principal face 11a of the insulating substrate 11, and more specifically, the wiring line 12 includes: at least one metallic layer selected from an adherent layer 12ca and a barrier layer 12cb as an inner layer; and a principal conductor layer 12cc as an outermost layer. For example, the outermost layer of the wiring line 12, i.e., the principal conductor layer 12cc, is formed of a layer of gold, which is a metal that has a hardness of as low as 20 to 50 hv, exhibits low electrical resistance, and excels in electrical conductivity.

For example, the wiring line 12 is formed so as to lie on the principal face 11a of the insulating substrate 11 by using a thin-film forming technique such as lift-off technique. Moreover, for enhanced adhesion between the insulating substrate and the principal conductor layer 12cc constituting the outermost layer of the wiring line 12, i.e., the gold layer, the adherent layer 12ca is disposed as an inner layer between the insulating substrate 11 and the principal conductor layer 12cc. For example, the adherent layer 12ca is formed of a layer of titanium, which is a metal having good adherability. The titanium layer has a hardness of about 140 hv.

Moreover, between the principal conductor layer 12cc in gold-layer form and the adherent layer 12ca in titanium-layer form, there is provided the barrier layer 12cb serving as a barrier to restrain gold from spreading to the adherent layer 12ca in titanium-layer form. The barrier layer 12cb is formed of at least one selected from a platinum layer and a palladium layer. Platinum and palladium are metals that deliver good barrier performance. The platinum layer has a hardness of 50 to 110 hv, and the palladium layer has a hardness of 40 to 110 hv.

Moreover, in the wiring line 12, the adherent layer 12ca is set to 0.02 to 0.2 µm in thickness, the barrier layer 12cb is set to 0.05 to 0.5 µm in thickness, and the principal conductor layer 12cc is set to 0.2 to 5.0 µm in thickness.

Following is an example of the method of producing the wiring line 12. A copper metallic layer is formed on the entire principal face 11a of the insulating substrate 11 made of an aluminum nitride sintered body by using a thin-film forming technique such as vapor deposition, ion plating, or sputtering.

Next, resist processing is performed to provide a resist for wiring line 12-pattern formation, and, after a copper plating layer is formed on the copper metallic layer exposed by means of plating or otherwise, the resist is removed. Then, the exposed copper metallic layer is removed by etching to form a lift-off mold for the formation of the wiring line 12. For example, copper is dissoluble in an ammonium persulfate solution, and hence the use of such a solution permits easy etching of the exposed copper metallic layer. Moreover, if the concentration of dissolved copper in the ammonium persulfate solution is adjusted to 1 to 10 g/L, such a control stabilizes the rate of copper etching, ensuring the formation of a high-precision lift-off mold.

After that, the adherent layer 12ca in titanium-layer form, the barrier layer 12cb which is at least one selected from a platinum layer and a palladium layer, and the principal conductor layer 12cc in gold-layer form are formed one after another on the entire surface of the insulating substrate 11 bearing the mold by using a thin-film forming technique such as vapor deposition, ion plating, or sputtering. Then, a lift-off process is performed to remove the mold. The method thus far described permits the formation of the wiring line 12 of predetermined pattern. In the above-described method, metallic particles constituting each layer to be deposited by means of vapor deposition, ion plating, sputtering, or otherwise can be caused to enter at a right angle with respect to the insulating substrate 11 in the interest of higher removability of the mold in the subsequent lift-off process.

Moreover, like the wiring line 12, a wiring conductor other than the wiring line 12 may also be provided so as to lie on the principal face 11a of the insulating substrate 11 by using a thin-film forming technique such as the lift-off technique. Other wiring conductor than the wiring line 12 may be formed concurrently with the formation of the wiring line 12.

Moreover, in the making of the wiring substrate 1 of small size, a multi-piece substrate including a matrix of a plurality of insulating substrate 11-forming regions may be used for ease of handling and efficient production of many wiring substrates 1. In the above-described case, the plurality of insulating substrate 11-forming regions are each formed with the wiring line 12 at one time, and then the substrate is cut along the outer edge of each insulating substrate 11-forming region by slicing operation, for example. This procedure permits efficient formation of the wiring substrate 1 including the wiring line 12 located on the principal face 11a.

As described above, the wiring substrate 1 includes: the insulating substrate 11 including the principal face 11a; and the wiring line 12 located on the principal face 11a, and on a side of the wiring line 12 being provided a protruding portion 12a which is smaller in thickness than the wiring line 12, and protrudes from the side along the principal face 11a. With the above-described design, for example, in the case where the resistor layer 4 is disposed on the wiring line 12, even with the transmission of external heat or the application of heat liberated from the resistor layer 4 and the wiring line 12 during operation of the electronic device, etc., and ensuing heat dissipation, etc., which result in a difference in thermal shrinkage between the wiring line 12 and the insulating substrate 11, the placement of the protruding portion 12a of small thickness on the side of the wiring line 12 makes it possible to lessen a stress resulting from the difference in thermal shrinkage between the wiring line 12 and the insulating substrate 11, and thereby reduce the occurrence of a break in the resistor layer 4 at the boundary between the wiring line 12 and the insulating substrate 11 in the resistor layer 4. The protruding portion 12a is set to 5 to 100 nm in thickness.

Moreover, as in an example shown in FIG. 1, the protruding portion 12a may be provided on each of the opposed sides of the wiring line 12. With the above-described design, for example, in the case where the resistor layer 4 is disposed on the opposed sides of the wiring line 12, even with the transmission of external heat or the application of heat liberated from the resistor layer 4 and the wiring line 12 during operation of the electronic device, etc., and ensuing heat dissipation, etc., which result in a difference in thermal shrinkage between the wiring line 12 and the insulating substrate 11, the placement of the protruding portion 12a of small thickness on each of the opposed sides of the wiring line 12 makes it possible to lessen a stress resulting from the difference in thermal shrinkage between the wiring line 12 and the insulating substrate 11, and thereby reduce the occurrence of a break in the resistor layer 4 at the boundary between the wiring line 12 and the insulating substrate 11 in the resistor layer 4.

Moreover, the wiring line 12 includes the adherent layer 12ca, the barrier layer 12cb, and the principal conductor layer 12cc that are arranged, in multi-layer form, in the order from the principal face 11a of the insulating substrate 11. Moreover, the protruding portion 12a contains a part of the principal conductor layer 12cc. With the above-described design, for example, in the case where the resistor layer 4 is disposed on the side of the wiring line 12, even with the transmission of external heat or the application of heat liberated from the resistor layer 4 and the wiring line 12 during operation of the electronic device, etc., and ensuing heat dissipation, etc., which result in a difference in thermal shrinkage between the wiring line 12 and the insulating substrate 11, the placement of the protruding portion 12a of small thickness, which contains the part of the principal conductor layer 12cc in the form of a low-hardness gold layer for example, on the side of the wiring line 12 makes it possible to further lessen a stress resulting from the difference in thermal shrinkage between the wiring line 12 and the insulating substrate 11, and thereby reduce the occurrence of a break in the resistor layer 4 at the boundary between the wiring line 12 and the insulating substrate 11 in the resistor layer 4.

Moreover, if the protruding portion 12a is made smaller in thickness than the adherent layer 12ca, for example, in the case where the resistor layer 4 is disposed on the wiring line 12, even with the transmission of external heat or the application of heat liberated from the resistor layer 4 and the wiring line 12 during operation of the electronic device, etc., and ensuing heat dissipation, etc., which result in a difference in thermal shrinkage between the wiring line 12 and the insulating substrate 11, the placement of the protruding portion 12a, which is smaller in thickness than the adherent layer 12ca, on the side of the wiring line 12 makes it possible to further lessen a stress resulting from the difference in thermal shrinkage between the wiring line 12 and the insulating substrate 11, and thereby reduce the occurrence of a break in the resistor layer 4 at the boundary between the wiring line 12 and the insulating substrate 11 in the resistor layer 4.

Moreover, as in examples shown in FIGS. 4 to 8, if the protruding portion 12a contains a part of the barrier layer 12cb located between the part of the principal conductor layer 12cc of the protruding portion 12a and the principal face 11a of the insulating substrate 11, for example, in the case where the resistor layer 4 is disposed on the side of the wiring line 12, even with the transmission of external heat or the application of heat liberated from the resistor layer 4 and the wiring line 12 during operation of the electronic device, etc., the principal conductor layer 12cc of the protruding portion 12a, in the form of a gold layer for example, is less prone to being diffused toward the insulating substrate 11, and the part of the principal conductor layer 12cc is thus contained in the protruding portion 12a. Furthermore, even if a difference in thermal shrinkage arises between the wiring line 12 and the insulating substrate 11 due to heat dissipation that ensued, etc., the placement of the protruding portion 12a of small thickness, which contains the part of the principal conductor layer 12cc, on the side of the wiring line 12 makes it possible to further lessen a stress resulting from the difference in thermal shrinkage between the wiring line 12 and the insulating substrate 11, and thereby reduce the occurrence of a break in the resistor layer 4 at the boundary between the wiring line 12 and the insulating substrate 11 in the resistor layer 4.

Moreover, as in the examples shown in FIGS. 4 to 8, if the protruding portion 12a contains a part of the adherent layer 12ca located between the barrier layer 12cb of the protruding portion 12a and the principal face 11a of the insulating substrate 11, for example, in the case where the resistor layer 4 is disposed on the side of the wiring line 12, even with the transmission of external heat or the application of heat liberated from the resistor layer 4 and the wiring line 12 during operation of the electronic device, etc., and also, even with a difference in thermal shrinkage between the wiring line 12 and the insulating substrate 11 caused by heat dissipation that ensued, etc., the placement of the protruding portion 12a of small thickness on the principal face 11a of the insulating substrate 11, as well as the placement of the protruding portion 12a of small thickness, which contains the part of the principal conductor layer 12cc in the form of a low-hardness gold layer for example, on the side of the wiring line 12, makes it possible to further lessen a stress resulting from the difference in thermal shrinkage between the wiring line 12 and the insulating substrate 11, and thereby reduce the occurrence of a break in the resistor layer 4 at the boundary between the wiring line 12 and the insulating substrate 11 in the resistor layer 4.

Moreover, in a vertical sectional view, a part of the principal conductor layer 12cc is located on the side of the barrier layer 12cb. With the above-described design, for example, in the case where the resistor layer 4 is disposed on the wiring line 12, even with the transmission of external heat or the application of heat liberated from the resistor layer 4 and the wiring line 12 during operation of the electronic device, etc., and ensuing heat dissipation, etc., which result in a difference in thermal shrinkage between the wiring line 12 and the insulating substrate 11, the placement of the principal conductor layer 12cc, in the form of a low-hardness gold layer for example, on the side of the barrier layer 12cb makes it possible to further lessen a stress resulting from the difference in thermal shrinkage between the wiring line 12 and the insulating substrate 11, and thereby reduce the occurrence of a break in the resistor layer 4 at the boundary between the wiring line 12 and the insulating substrate 11 in the resistor layer 4.

Moreover, as in the examples shown in FIGS. 4 to 8, in a vertical sectional view, a part of the barrier layer 12cb and a part of the principal conductor layer 12cc are arranged on the side of the adherent layer 12ca and are arranged in that order from the side of the adherent layer 12ca. With the above-described design, for example, in the case where the resistor layer 4 is disposed on the side of the wiring line 12, even with the transmission of external heat or the application of heat liberated from the resistor layer 4 and the wiring line 12 during operation of the electronic device, etc., the placement of the principal conductor layer 12cc in the form of, for example, a low-hardness gold layer at the side of the adherent layer 12ca makes it possible to further lessen a stress resulting from the difference in thermal shrinkage between the wiring line 12 and the insulating substrate 11, and thereby reduce the occurrence of a break in the resistor layer 4 at the boundary between the wiring line 12 and the insulating substrate 11 in the resistor layer 4.

Moreover, a part of the principal conductor layer 12cc continuously extends along the side of the wiring line 12 and further along the protruding portion 12a. With the above-described design, for example, in the case where the resistor layer 4 is disposed on the wiring line 12, even with the transmission of external heat or the application of heat liberated from the resistor layer 4 and the wiring line 12 during operation of the electronic device, etc., and ensuing heat dissipation, etc., which result in a difference in thermal shrinkage between the wiring line 12 and the insulating substrate 11, the placement of the principal conductor layer 12cc in the form of, for example, a low-hardness gold layer at and around the boundary between the wiring line 12 and the insulating substrate 11 makes it possible to effectively lessen a stress resulting from the difference in thermal shrinkage between the wiring line and the insulating substrate 11, and thereby reduce the occurrence of a break in the resistor layer 4 at the boundary between the wiring line 12 and the insulating substrate 11 in the resistor layer 4.

Moreover, a part of the barrier layer 12cb continuously extends along the side of the wiring line 12 and further along the protruding portion 12a. With the above-described design, for example, in the case where the resistor layer 4 is disposed on the side of the wiring line 12, even with the transmission of external heat or the application of heat liberated from the resistor layer 4 and the wiring line 12 during operation of the electronic device, etc., in the range from the side of the wiring line 12 to the protruding portion 12a, the principal conductor layer 12cc of the protruding portion 12a, in the form of a gold layer for example, is less prone to being diffused over the adherent layer 12ca toward the insulating substrate 11. Furthermore, even if a difference in thermal shrinkage arises between the wiring line 12 and the insulating substrate 11 due to heat dissipation that ensued, etc., the placement of the principal conductor layer 12cc extending along the side of the wiring line 12 and further along the protruding portion 12a makes it possible to effectively lessen a stress resulting from the difference in thermal shrinkage between the wiring line 12 and the insulating substrate 11, and thereby reduce the occurrence of a break in the resistor layer 4 at the boundary between the wiring line 12 and the insulating substrate 11 in the resistor layer 4.

Moreover, a part of the adherent layer 12ca continuously extends along the side of the wiring line 12 and further along the protruding portion 12a. With the above-described design, for example, in the case where the resistor layer 4 is disposed on the side of the wiring line 12, even with the transmission of external heat or the application of heat liberated from the resistor layer 4 and the wiring line 12 during operation of the electronic device, etc., and also, even with a difference in thermal shrinkage between the wiring line 12 and the insulating substrate 11 caused by heat dissipation that ensued, etc., the placement of the principal conductor layer 12cc extending along the side of the wiring line 12 and further along the protruding portion 12a makes it possible to effectively lessen a stress resulting from the difference in thermal shrinkage between the wiring line 12 and the insulating substrate 11, and thereby reduce the occurrence of a break in the resistor layer 4 at the boundary between the wiring line 12 and the insulating substrate 11 in the resistor layer 4.

Figure 8:
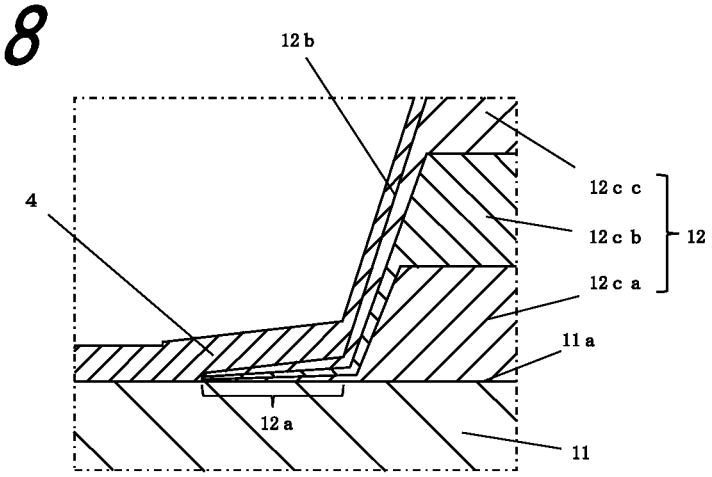
FIG. 8 is a main-part enlarged view showing still another example of the electronic device according to the embodiment.

Moreover, as in an example shown in FIG. 8, if the protruding portion 12a is configured so that a thickness thereof becomes smaller gradually from one end located toward the side of the wiring line 12 to the other opposite end, for example, in the case where the resistor layer 4 is disposed on the wiring line 12, even with the transmission of external heat or the application of heat liberated from the resistor layer 4 and the wiring line 12 during operation of the electronic device, etc., and ensuing heat dissipation, etc., which result in a difference in thermal shrinkage between the wiring line 12 and the insulating substrate 11, the described configuration of the protruding portion 12a makes it possible to minimize the concentration of a stress, which results from the difference in thermal shrinkage between the wiring line 12 and the insulating substrate 11, on the boundary between the wiring line 12 and the insulating substrate 11, and thereby reduce the occurrence of a break in the resistor layer 4 at the boundary between the wiring line 12 and the insulating substrate 11 in the resistor layer 4.

Moreover, as in examples shown in FIGS. 5 to 8, the wiring line 12 may include at the side, an inclined portion 12b inclined toward the protruding portion 12a, and the inclined portion 12b may be connected to the protruding portion 12a. With the above-described design, for example, in the case where the resistor layer 4 is disposed on the wiring line 12, even with the transmission of external heat or the application of heat liberated from the resistor layer 4 and the wiring line 12 during operation of the electronic device, etc., and ensuing heat dissipation, etc., which result in a difference in thermal shrinkage between the wiring line 12 and the insulating substrate 11, the placement of the inclined portion 12b inclined toward the protruding portion 12a, which allows the resistor layer 4 to have an obtuse-angled bend, as well as the placement of the inclined portion 12b inclined toward the protruding portion 12a and the protruding portion 12a of small thickness connected to the inclined portion 12b, makes it possible to effectively lessen a stress resulting from the difference in thermal shrinkage between the wiring line 12 and the insulating substrate 11, and thereby further reduce the occurrence of a break in the resistor layer 4 at the boundary between the wiring line 12 and the insulating substrate 11 in the resistor layer 4.

The electronic device is produced by mounting the electronic component 2 such as a semiconductor laser device on the wiring substrate 1 provided with the resistor layer 4 located on the wiring line 12. In the case where the electronic component 2 is of the type to be mounted by wire bonding, the electronic component 2 is secured onto a wiring conductor via a joining material such as solder first, and is then electrically connected at an electrode thereof to the wiring line 12, etc. via a connecting member 3 such as a bonding wire. The electronic component 2 is thus mounted on the wiring substrate 1.

The disclosure is not limited to the described embodiments, and hence various changes and modifications may be made therein. For example, although the insulating substrate 11 is illustrated as being quadrangular in plan configuration, it may be circular in plan configuration instead. Moreover, a plurality of electronic components 2 may be mounted on the wiring substrate 1.

The invention claimed is:

1. A wiring substrate, comprising:
   an insulating substrate comprising a principal face;
   a wiring line located on the principal face; and
   a protruding portion on a side of the wiring line, the protruding portion being smaller in thickness than the wiring line and protruding from the side along the principal face,
   wherein the wiring line comprises an adherent layer, a barrier layer, and a principal conductor layer, which are arranged, in multi-layer form, in an order from the principal face of the insulating substrate, and
   an edge of a surface of the principal conductor layer whose surface is located away from the barrier layer, is located on a side opposite to the protruding portion in a direction extending along the principal face with respect to an edge of a surface of the principal conductor layer whose surface is located near the barrier layer.

2. The wiring substrate according to claim 1, wherein the wiring line comprises at the side an inclined portion, the inclined portion inclined toward the protruding portion and connected to the protruding portion.

3. The wiring board according to claim 2,
   the protruding portion comprises a part of the principal conductor layer.

4. The wiring board according to claim 3,
   wherein a part of the principal conductor layer continuously extends along the side of the wiring line and further along the protruding portion.

5. The wiring board according to claim 3,
   wherein a part of the barrier layer continuously extends along the side of the wiring line and further along the protruding portion.

6. The wiring board according to claim 3,
   wherein a part of the adherent layer continuously extends along the side of the wiring line and further along the protruding portion.

7. The wiring substrate according to claim 1,
   the protruding portion comprises a part of the principal conductor layer.

8. The wiring substrate according to claim 7,
   wherein the protruding portion comprises a part of the barrier layer located between the principal conductor layer of the protruding portion and the principal face of the insulating substrate.

9. The wiring substrate according to claim 8,
wherein the protruding portion comprises a part of the adherent layer located between the part of the barrier layer of the protruding portion and the principal face of the insulating substrate.

10. The wiring board according to claim 9,
wherein, in a vertical sectional view of the wiring board, a part of the principal conductor layer is located on a side of the barrier layer.

11. The wiring board according to claim 9,
wherein, in a vertical sectional view of the wiring board, a part of the barrier layer and a part of the principal conductor layer are located on a side of the adherent layer, and which are arranged in that order from the side of the adherent layer.

12. The wiring board according to claim 8,
wherein, in a vertical sectional view of the wiring board, a part of the principal conductor layer is located on a side of the barrier layer.

13. The wiring board according to claim 8,
wherein, in a vertical sectional view of the wiring board, a part of the barrier layer and a part of the principal conductor layer are located on a side of the adherent layer, and which are arranged in that order from the side of the adherent layer.

14. The wiring substrate according to claim 7,
wherein, in a vertical sectional view of the wiring substrate, a part of the principal conductor layer is located on a side of the barrier layer.

15. The wiring board according to claim 14,
wherein, in a vertical sectional view of the wiring board, a part of the barrier layer and a part of the principal conductor layer are located on a side of the adherent layer, and which are arranged in that order from the side of the adherent layer.

16. The wiring substrate according to claim 7,
wherein, in a vertical sectional view of the wiring substrate, a part of the barrier layer and a part of the principal conductor layer are located on a side of the adherent layer and are arranged in that order from the side of the adherent layer.

17. The wiring substrate according to claim 7,
wherein a part of the principal conductor layer continuously extends along the side of the wiring line and further along the protruding portion.

18. The wiring substrate according to claim 7,
wherein a part of the barrier layer continuously extends along the side of the wiring line and further along the protruding portion.

19. The wiring substrate according to claim 7,
wherein a part of the adherent layer continuously extends along the side of the wiring line and further along the protruding portion.

20. An electronic device, comprising:
a wiring substrate according to claim 1;
a resistor layer located on the wiring line; and
an electronic component mounted on the wiring substrate.

* * * * *